(12) United States Patent
Anderson et al.

(10) Patent No.: US 11,437,317 B2
(45) Date of Patent: Sep. 6, 2022

(54) SINGLE-MASK ALTERNATING LINE DEPOSITION

(71) Applicant: INTERNATIONAL BUSINESS MACHINES CORPORATION, Armonk, NY (US)

(72) Inventors: Brent Alan Anderson, Jericho, VT (US); Lawrence A. Clevenger, Saratoga Springs, NY (US); Christopher J. Penny, Saratoga Springs, NY (US); Kisik Choi, Watervliet, NY (US); Nicholas Anthony Lanzillo, Wynantskill, NY (US); Robert Robison, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/786,393

(22) Filed: Feb. 10, 2020

(65) Prior Publication Data
US 2021/0249351 A1 Aug. 12, 2021

(51) Int. Cl.
*H01L 23/528* (2006.01)
*H01L 21/768* (2006.01)

(52) U.S. Cl.
CPC ...... *H01L 23/5283* (2013.01); *H01L 21/7684* (2013.01); *H01L 21/76804* (2013.01); *H01L 21/76829* (2013.01); *H01L 21/76834* (2013.01); *H01L 21/76877* (2013.01)

(58) Field of Classification Search
CPC ......... H01L 21/76834; H01L 21/76804; H01L 21/76877; H01L 21/7684; H01L 21/76829
See application file for complete search history.

(56) References Cited

U.S. PATENT DOCUMENTS

| | | | |
|---|---|---|---|
| 6,924,222 B2 | 8/2005 | Goodner et al. | |
| 7,422,975 B2 | 9/2008 | Nogami et al. | |
| 7,732,343 B2 | 6/2010 | Niroomand et al. | |
| 7,816,262 B2 | 10/2010 | Juengling | |
| 8,202,803 B2 | 6/2012 | Feurprier et al. | |
| 9,437,483 B2 | 9/2016 | Lee et al. | |
| 9,882,028 B2 | 1/2018 | Cheng et al. | |
| 2005/0233505 A1* | 10/2005 | Seo | H01L 27/10814 438/128 |
| 2014/0175650 A1* | 6/2014 | Singh | H01L 21/76808 257/751 |
| 2019/0019748 A1 | 1/2019 | Wallace et al. | |

(Continued)

OTHER PUBLICATIONS

Briggs, B. et al., "N5 Technology Node Dual-Damascene Interconnects Enabled Using Multi Patterning" 2017 IEEE International Interconnect Technology Conference (IITC) (May 2017) pp. 1-3.

(Continued)

*Primary Examiner* — Thanhha S Pham
(74) *Attorney, Agent, or Firm* — Tutunjian & Bitetto, P.C.; Randall Bluestone

(57) ABSTRACT

Integrated chips and methods of forming lines in the same include forming first lines on a underlying substrate. Conformal dielectric spacers are formed on sidewalls of the first lines. Second lines are formed on the underlying substrate, in open areas between the dielectric spacers.

18 Claims, 6 Drawing Sheets

(56) References Cited

U.S. PATENT DOCUMENTS

2020/0144273 A1* 5/2020 Huang .............. H01L 27/10855
2020/0373304 A1* 11/2020 Borsari ............ H01L 21/76831

OTHER PUBLICATIONS

Gillijns, W. et al., "Impact of a SADP flow on the design and process for N10/N7 Metal layers" Proceedings of SPIE (Mar. 2015) pp. 942709-1-942709-9, vol. 9427.

* cited by examiner

SINGLE-MASK ALTERNATING LINE DEPOSITION

BACKGROUND

The present invention generally relates to integrated chip fabrication, and, more particularly, to the fabrication of lines in an integrated chip.

Patterning the conductive lines to form these interconnects, particularly at small dimensions, can involve the use of multiple photolithographic masks, each with respective deposition, developing, and etching processes, such that each additional mask adds expense to the fabrication process.

SUMMARY

A method of forming lines in an integrated chip includes forming first lines on an underlying substrate. Conformal dielectric spacers are formed on sidewalls of the first lines. Second lines are formed on the underlying substrate, in open areas between the dielectric spacers.

A method of forming lines in an integrated chip includes forming an etch stop layer on an underlying substrate, the etch stop layer having gaps that expose a top surface of the underlying substrate. First lines are formed on the exposed surface of the underlying substrate, in the gaps of the etch stop layer. A layer of dielectric material is conformally deposited on exposed surfaces of the first lines. Dielectric material is anisotropically etched from the layer of dielectric material that is on horizontal surfaces above and between the first lines. The anisotropic etch is blocked in part by a top portion of the conformal dielectric spacers, such that the conformal dielectric spacers each include a foot of dielectric material that extends laterally from a bottom portion of the respective conformal dielectric spacer, into a space between the first lines. Second lines are formed on the underlying substrate, in openings left between the dielectric spacers.

An integrated chip includes first lines, formed on an underlying substrate. Spacers are formed conformally on sidewalls of the plurality of lines. Etch stop remnants are positioned on the sidewalls of the plurality of lines, between the spacers and the underlying substrate. Second lines are formed on the underlying substrate, between respective pairs of adjacent first lines.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention form lines on a substrate using an integrated process. This makes it possible to form, for example, lines of alternating materials with a single mask. To accomplish this, the present embodiments form spacers on a first set of lines using a conformal deposition process. These spacers are formed to a thickness that leaves a gap between them, which establishes a location for a second set of lines. The gap is then filled with material, which can be distinct from the material that is used to form the first lines, to form a second set of lines. While it is specifically contemplated that the lines can be conductive lines, and can be used to form interconnects between device components, it should be understood that the present principles can be employed to form line structures from any appropriate materials, and for any appropriate purpose.

Integrated chips can be formed with multiple device layers, each including a variety of active and passive circuit components. These device layers can be stacked on top of one another, thereby greatly increasing the density of circuit components per unit area on a particular chip. However, such three-dimensional chip design poses a challenge in connecting components between different layers, and even between different regions on a single layer. To provide this interlayer and intralayer signaling capacity, conductive interconnects and vias can be formed on a separate interconnect layer, or within a device layer, to conduct electrical signals from one component to another. To accomplish this, lines of conductive material can be formed, and then cut according to a design pattern, to create conductive lines in appropriate locations on the chip, thereby making conductive contact with the components on the chip.

Figure 1:
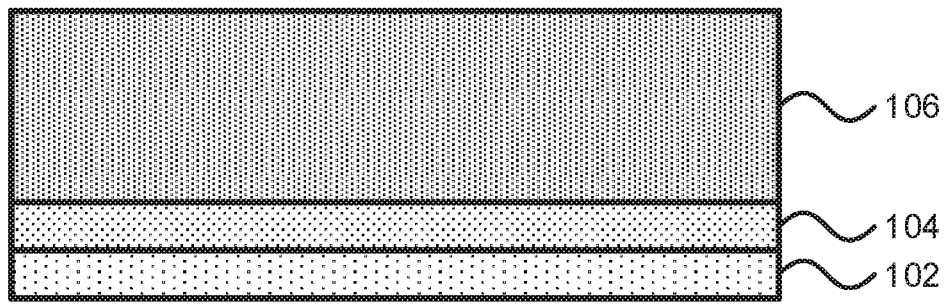
FIG. 1 is a cross-sectional diagram of a step in the single-mask, dual material fabrication of lines in an integrated chip, showing the formation of an etch stop layer and a dielectric layer on an underlying layer, such as a semiconductor device layer, in accordance with an embodiment of the present invention.

Referring now to the drawings in which like numerals represent the same or similar elements and initially to FIG. 1, a cross-sectional view of a step in the fabrication of lines in an integrated chip is shown. An etch stop layer 104 is formed on a substrate 102. In some embodiments, the substrate layer 102 can be formed from, e.g., a dielectric material such as silicon dioxide or a glass material. The substrate layer 102 can include active and/or passive electronic components, such as transistors, capacitors, transmission lines, vias, etc. There can additionally be one or more further layers underlying the substrate layer 102, with connectivity between the layers being provided by via structures. The substrate 102 can thus represent a large and complex structure. The etch stop layer 104 protects the substrate 102 from damage during subsequent processing in the formation of the lines.

A dielectric layer 106 is formed over the etch stop layer 104. The combined height of the dielectric layer 106 and the etch stop layer 104 defines the height of the lines that will be formed in subsequent steps. The dielectric layer 106 and the etch stop layer 104 can be formed from any appropriate materials having etch selectivity with respect to one another, such as silicon dioxide and silicon nitride. It should be understood that, although a dielectric material is specifically contemplated, any material with suitable etch selectivity can be used, as the dielectric layer 106 may be removed in subsequent steps, such that its electrical properties will have no effect on the final structure. As used herein, the term "selective," in reference to a material removal process, denotes that the rate of material removal for a first material is greater than the rate of removal for at least another material of the structure to which the material removal process is being applied.

The etch stop layer 104 and the dielectric layer 106 can be deposited by any appropriate deposition process, such as chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
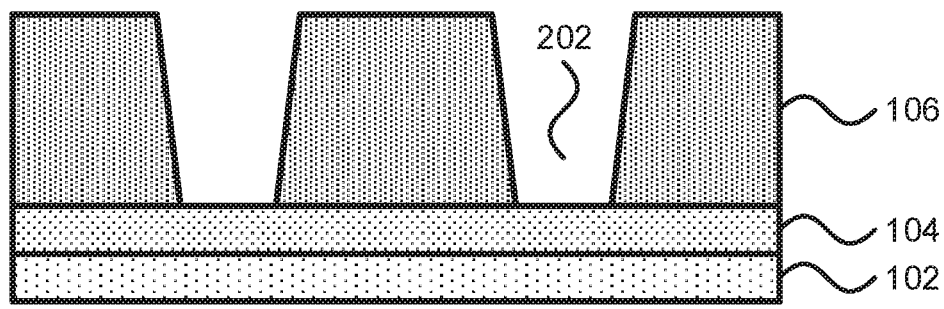
FIG. 2 is a cross-sectional diagram of a step in the single-mask, dual material fabrication of lines in an integrated chip, showing the formation of trenches in the dielectric layer using an anisotropic etch to define first line locations, in accordance with an embodiment of the present invention.

Referring now to FIG. 2, a cross-sectional view of a step in the fabrication of lines in an integrated chip is shown. Trenches 202 are etched into the dielectric layer 106. The trenches 202 can be formed by forming a mask over the dielectric layer 106 using any appropriate process, such as photolithography. It is specifically contemplated that the mask can be formed with a pattern that has openings separated by a distance that is twice the pitch of the lines that are being fabricated.

The trenches 202 are formed by a selective anisotropic etch, such as a reactive ion etch (RIE), that removes the material of the dielectric layer 106 and that stops on the etch stop layer 104, preventing the etch from damaging the underlying substrate layer 102. RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Notably, imperfections in the anisotropic etch can result in trenches 202 with a tapered profile, such that the width of the trenches 202 at the top is greater than the width of the trenches 202 at the bottom. The slope of the sidewalls of the trenches 202 will depend on the particulars of the dielectric material 106 and the chemistry of the etching process. The slope is shown as being substantial in the present figures, but it should be understood that any appropriate slope can be achieved.

Figure 3:
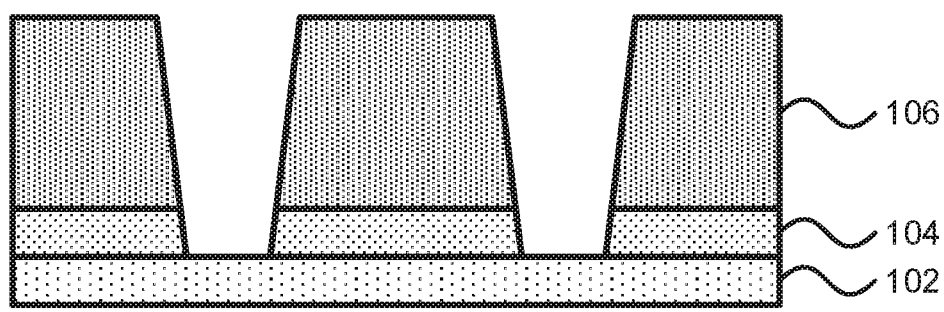
FIG. 3 is a cross-sectional diagram of a step in the single-mask, dual material fabrication of lines in an integrated chip, showing the extension of the trenches in the dielectric layer, down into the etch stop layer using an anisotropic etch, in accordance with an embodiment of the present invention.

Referring now to FIG. 3, a cross-sectional view of a step in the fabrication of lines in an integrated chip is shown. A second selective, anisotropic etch is used to remove exposed material from the etch stop layer 104, thereby exposing the underlying substrate layer 102. The deepened trenches 302 can, for example, expose portions of the substrate layer 102 that include conductive vias and interconnects to provide for signal communication between layers.

It should be understood that, because the material of the etch stop layer 104 and the chemistry of the second anisotropic etch are different from those used to form the trenches 202, the slope of the sidewalls of the portion of trenches 302 in the etch stop layer 104 can differ from the slope of the sidewalls of the portion of trenches 302 in the dielectric layer 106. In some embodiments, the slope in the etch stop layer 104 can be steeper than the slope in the dielectric layer 106, while in other embodiments, the slope in the dielectric layer 106 can be steeper than the slope in the etch stop layer. In yet other embodiments, the materials and etch chemistries can be carefully controlled to produce slopes in the two layers that are substantially the same, as shown herein.

Figure 4:
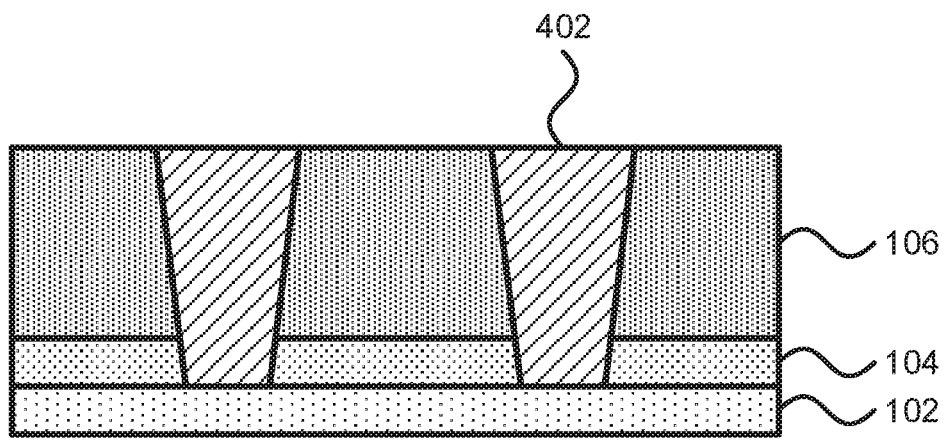
FIG. 4 is a cross-sectional diagram of a step in the single-mask, dual material fabrication of lines in an integrated chip, showing the deposition and polishing of first lines to fill the trenches, in accordance with an embodiment of the present invention.

Referring now to FIG. 4, a cross-sectional view of a step in the fabrication of lines in an integrated chip is shown. A layer of first line material is deposited by any appropriate deposition process, such as CVD, ALD, or PVD. Excess material is removed, exposing the top surface of the dielectric layer 106 and forming first lines 402. The excess material can be removed by, e.g., a chemical mechanical planarization (CMP) process.

CMP is performed using, e.g., a chemical or granular slurry and mechanical force to gradually remove upper layers of the device. The slurry may be formulated to be unable to dissolve, for example, the material of the dielectric layer 106, resulting in the CMP process's inability to proceed any farther than that layer.

The first line material can be any appropriate material that has etch selectivity relative to the dielectric layer 106 and the etch stop layer 104, and it is specifically contemplated that the first line material can be a conductive material. Conductive materials may include, for example, any appropriate conductive metal such as tungsten, nickel, titanium, molybdenum, tantalum, copper, platinum, silver, gold, ruthenium, iridium, rhenium, rhodium, and alloys thereof. The conductive material may alternatively be formed from a doped semiconductor material such as, e.g., doped polysilicon.

Following the discussion above, relating to the slopes of the sidewalls in the different regions of the trenches 302, the sidewalls of the first lines 402 will have a complementary slope. Thus, the sidewalls of the first lines 402 may change in slope at the height defined by the interface between the etch stop layer 104 and the dielectric layer 106.

Figure 5:
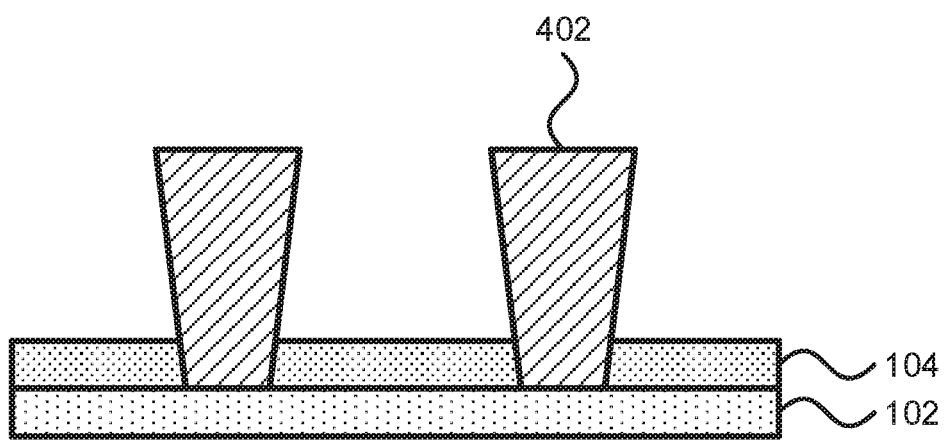
FIG. 5 is a cross-sectional diagram of a step in the single-mask, dual material fabrication of lines in an integrated chip, showing the removal of the dielectric layer using an isotropic etch and the exposure of sidewalls of the first lines above the etch stop layer, in accordance with an embodiment of the present invention.

Referring now to FIG. 5, a cross-sectional view of a step in the fabrication of lines in an integrated chip is shown. The dielectric layer 106 is etched away using any appropriately selective isotropic etch, exposing the sidewalls of the first lines 402 and the top surface of the etch stop layer 104. It is specifically contemplated that an isotropic etch can be used to remove the dielectric layer 106, such that the material is completely removed from underneath the overhang created by the sloping sidewalls of the first lines 402, but it should be understood that an anisotropic etch can be used instead, particularly if angled to cut under the overhang.

Figure 6:
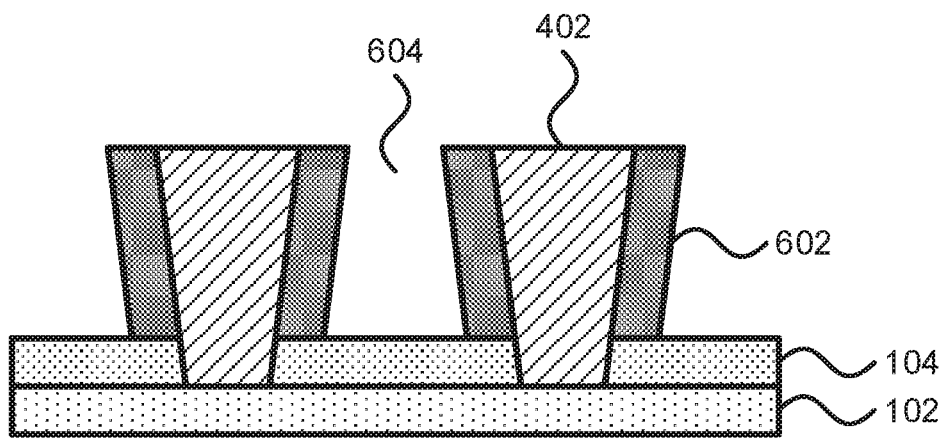
FIG. 6 is a cross-sectional diagram of a step in the single-mask, dual material fabrication of lines in an integrated chip, showing the deposition of conformal sidewall material and the subsequent removal of sidewall material from horizontal surfaces, forming spacers on the first lines, in accordance with an embodiment of the present invention.

Referring now to FIG. 6, a cross-sectional view of a step in the fabrication of lines in an integrated chip is shown. Spacers 602 are conformally formed on the sidewalls of the first lines 402 using any appropriate conformal deposition process, such as CVD or ALD, and can be formed from a dielectric material that is selectively etchable with respect to the etch stop layer 104. Excess spacer material can be removed from horizontal surfaces using a selective anisotropic etch.

It should be noted that the spacers 602 shown in FIG. 6 are idealized, and that, in practical embodiments, some material may remain on the top surface of the etch stop layer 104, between the spacers 602. This is because the angled sidewalls of the spacers 602 can protect the underlying surface from the anisotropic etch. At least a portion of the surface of the etch stop layer 104 will be exposed between the spacers 602.

The spacers 602 are formed to a predetermined thickness, leaving an opening 604 between the spacers. Due to the conformal deposition process, the spacers 602 will have a roughly uniform thickness along their height, with potential deviations at the bottom and the top that result from etch imperfections. The sloped sidewalls of the first lines 402 can result in the conformal spacers 602 being closer together at the top than at the bottom.

In alternative embodiments, the spacer material can be deposited to a greater thickness, even fully filling the space between the first lines 402. The spacer material can then be etched using a separate mask and etching step, which would result in openings 604 that are wider at the top than at the bottom.

Figure 7:
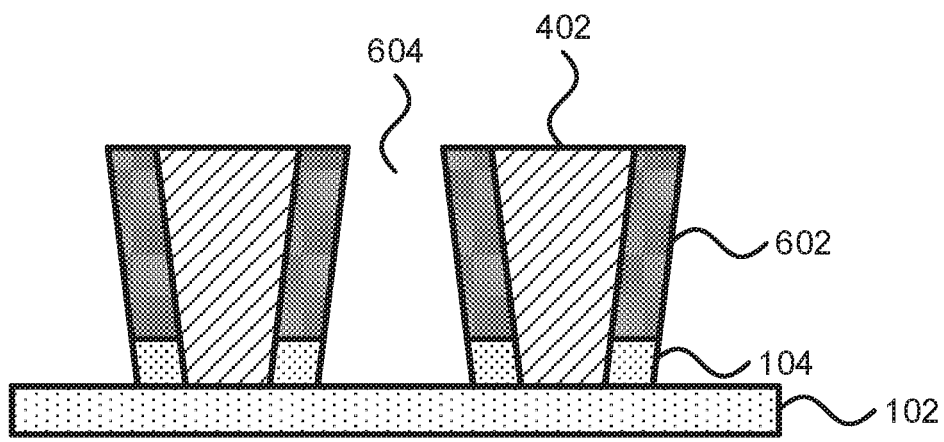
FIG. 7 is a cross-sectional diagram of a step in the single-mask, dual material fabrication of lines in an integrated chip, showing the removal of exposed etch stop material from horizontal surfaces between the first lines to expose the underlying layer, in accordance with an embodiment of the present invention.

Referring now to FIG. 7, a cross-sectional view of a step in the fabrication of lines in an integrated chip is shown. The exposed portions of the etch stop layer 104 are etched away, using a selective anisotropic etch that exposes the underlying substrate 102. Because the material of the etch stop layer 104 is carefully selected to be compatible with a relatively non-destructive anisotropic etch chemistry, the etch stop layer 104 can be removed, without causing substantial damage. As with the etch described above, in relation to FIG. 6, a small portion of the etch stop layer 104 may also be protected from the etch by the overhang of the spacers 602. Because the space 604 will be filled by a new dielectric, and because the remaining portions of the etch stop layer 104 will be quite small, they will have a negligible effect on the final capacitance. It should also be understood that the sidewalls of the etch stop layer 104 and the spacers 602 may be formed with differing slopes, due to the different properties of their respective materials and the etch chemistries used to remove them.

To achieve the idealized profile of the spacers 602 and the remnants of the etch stop layer 104, as shown in FIG. 7, multiple angled anisotropic etches can be used. The angle of the etches can be set to follow the angle of the sidewalls of lines 402, such that there will be no overhang to prevent access to material on the underlying surfaces.

Figure 8:
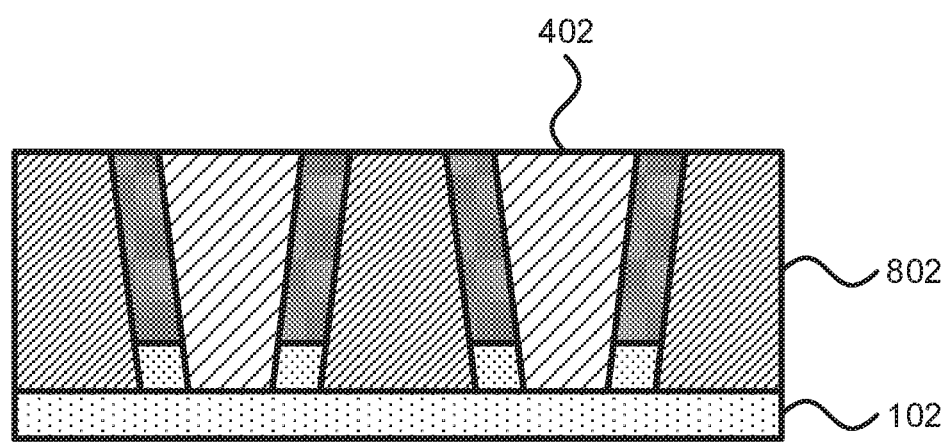
FIG. 8 is a cross-sectional diagram of a step in the single-mask, dual material fabrication of lines in an integrated chip, showing the formation of second lines, from a material distinct from that used in the first lines, in gaps between the conformal sidewall spacers, in accordance with an embodiment of the present invention.

Referring now to FIG. 8, a cross-sectional view of a step in the fabrication of lines in an integrated chip is shown. Second lines 802 are deposited in the openings 604 between first lines 402. The second lines 802 can be formed from any appropriate material, though it is specifically contemplated that a conductive material can be used. In particular, it is contemplated that a conductive material can be used that is different from the conductive material of the first lines 402, such that the alternating first and second lines produce alternating conductors, with distinct electrical properties.

Because the slope of the sidewalls of the first lines 402 is preserved by the conformal deposition of the spacers 602, the sidewalls of the second lines 802 will have a complementary slope. For example, because the anisotropic etch that forms the trenches for first lines 402 creates openings 202 that have a smaller width at the bottom than at the top, the first lines 402 will also have a smaller width at the bottom than at the top, while the second lines 802 may have a smaller width at the top than at the bottom. The term "complementary," as used herein, means that the respective sidewalls have equal and opposite slopes, as shown in FIG. 8.

Additionally, the slope of the portion of the second lines 802 that is formed against the remnants of the etch stop layer 104 can be different from the portion of the second lines 802 that is formed against the spacers 602. These differing slopes can result from the different slopes that result in the spacers 602 and the etch stop layer 104, the former being due to being conformally formed on the sidewalls of the first lines 402, which in turn inherit their slope from an anisotropic etch of the dielectric layer 106, while the latter is due to the anisotropic etch of the etch stop layer 104. In some embodiments, the slope of the top portion of the second lines 802 can be steeper than the slope of the bottom portion of the second lines 802, while in other embodiments, the slope of the bottom portion of the second lines 802 can be steeper than the top portion of the second lines 802. In yet other embodiments, the slopes can be made substantially identical, through careful selection of materials and etch chemistries, as shown in FIG. 8.

At this point, another etch stop layer can be deposited over the first lines 402 and the second lines 802, and another layer of the integrated chip can be formed. The positioning of the first lines 402 and the second lines 802 can be selected to align with vias, or with device contacts in the underlying substrate 102 and in any overlying device layer.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "an" "the" are intended to include the plural fogs as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components cl ups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms ended to encompass different orientations of the device in use or operation addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer referred to as being "between" two layers, it can be the only layer between the two layers, intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 9:
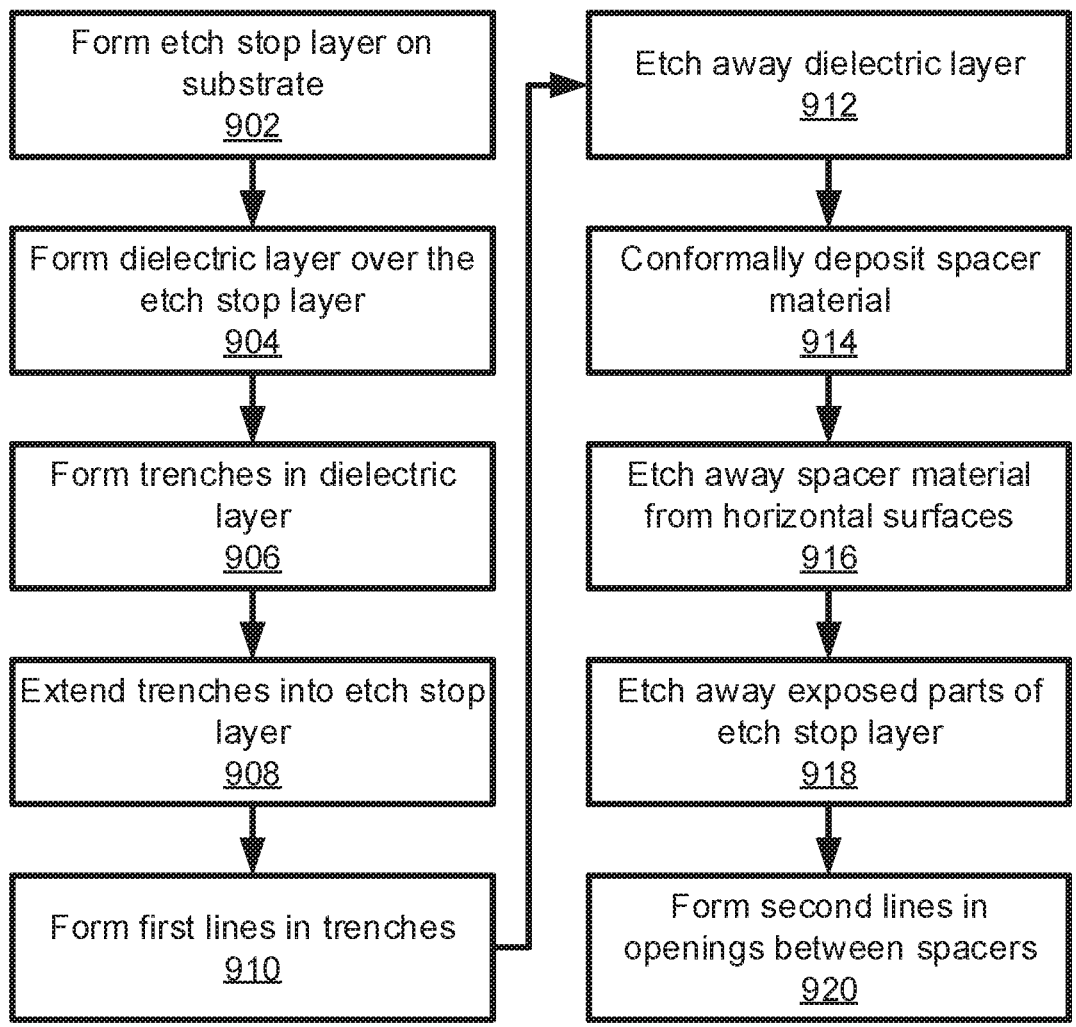
FIG. 9 is a block/flow diagram of a single-mask, dual-material fabrication method for lines in an integrated chip that uses conformal deposition of spacer material on a first set of lines to define the size and shape of a second set of lines.

Referring now to FIG. 9, a method of forming lines in an integrated chip is shown. Block 902 forms an etch stop layer 104 on a substrate layer 102 by any appropriate deposition process, for example such as CVD, ALD, PVD, or GCIB deposition. Block 904 forms dielectric layer 106 on the etch stop layer 104, by any appropriate deposition process, with a material that is selectively etchable with respect to the etch stop layer 104. The dielectric layer 106 is formed to a height that, combined with the height of the etch stop layer 104, defines the height of the lines.

Block 906 forms trenches 202 in the dielectric layer 106 using a mask and an anisotropic etch, such as an RIE. The chemistry of the anisotropic etch is selected to be selective, such that the etch stops on the top surface of the etch stop layer 104. Block 908 then anisotropically etches down into the etch stop layer 104 with a second selective etch chemistry, this time selected to remove material from the etch stop layer 104, without damaging the dielectric layer 106 and the underlying substrate layer 102.

Block 910 forms first lines 402 in the trenches 302. Block 910 first deposits the first line material, by any appropriate process, and then polishes the first line material down to the top surface of the dielectric layer 106 using a CMP process that stops on the material of dielectric layer 106. Block 912 etches away the dielectric layer 106 using a selective etch, such as an isotropic wet or dry chemical etch, to expose the sidewalls of the first lines 402 and the top surface of the etch stop layer 104.

Block 914 conformally deposits spacer material, such as a dielectric material, on the exposed sidewalls of the first lines 402, for example using a timed, conformal CVD or ALD process. The thickness of the spacer material is selected to leave an unfilled space between the first lines 402. This deposition incidentally also deposits spacer material on the top surfaces of the first lines 402 and on the exposed top surface of the etch stop layer 104.

Block 916 then etches away the spacer material that has been formed on horizontal surfaces using a selective anisotropic etch, leaving spacers 602. This etch may leave portions of the spacer material on the top surface of the etch stop layer 104, as a result of being blocked by an overhanging portion of the spacers 602. In some embodiments, the etch of block 916 can include carefully controlled angled anisotropic etches that are able to remove material from the entire top surface of the etch stop layer 104, without compromising the thickness of the spacers 602.

Block 918 etches away the exposed parts of the etch stop layer 104, for example using an anisotropic etch, to leave only those parts that are protected by the spacers 602. In embodiments that leave a portion of the spacer material on the top surface of the etch stop layer 104, the etch of block 918 may also leave a portion of the etch stop layer 104 that extends laterally from the first lines 402, this portion being preserved by a corresponding portion of the spacers 602. Block 920 then forms second lines 802 in the openings between the first lines 402, using any appropriate deposition process.

Figure 10:
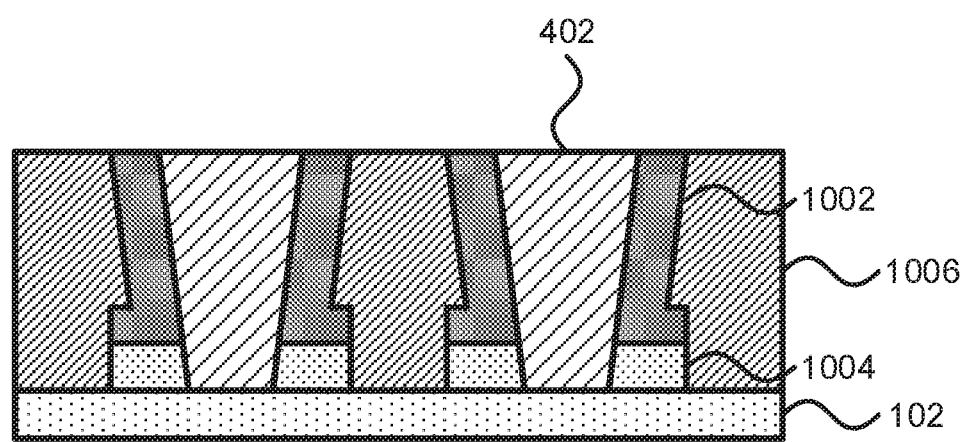
FIG. 10 is a cross-sectional diagram of an alternative embodiment of a step in the single-mask, dual material fabrication of lines in an integrated chip, feet on the conformal sidewall spacers that result from an anisotropic etch being blocked by overhanging portions of the conformal sidewall spacers, in accordance with an embodiment of the present invention.

Referring now to FIG. 10, an alternate view of a step in the fabrication of lines in an integrated chip is shown. As discussed above, in relation to FIGS. 6 and 7, the spacers 602 and the remnants of the etch stop layer 104 are shown in an idealized form. FIG. 10 illustrates an embodiment where the anisotropic etches in these steps are blocked from completely cleaning the exposed horizontal regions, due to overhand of the spacers.

The result is that the spacers 1002 will have a foot at the bottom, due to the inability of the etch to reach this portion of the material. The foot of the spacers 1002 then protects a greater amount of the etch stop layer 104, resulting in larger etch stop remnants 1004. As noted in the embodiments described above, the sidewalls of these bottom portions may also be sloped, and may have different slopes relative to one another, in accordance with the materials and the etch chemistries that are selected.

It should be noted that the profile of the second lines 1006 changes in this embodiment, as compared to the more idealized embodiments described above. This occurs as a result of the more complicated contours of the spacers 1002, including the foot portion. In particular, while the width of the second lines 1006 starts with a relatively narrow top portion and increases with depth, matching the slope of the spacers 1002, there is a sharp change of width at the point where the foot of the spacers 1002 juts out. Thus, the second lines 1006 can have a stepped profile, where the sidewalls have a first slope for a top portion, a substantially flat, horizontal portion, and a second slope for the portion below the step.

While the remainder of the slope of the second lines, below the top surface of the foot, is shown as being substantially vertical, this surface may instead taper down toward the very bottom of the second lines 1006, resulting from the anisotropic etch(es) that removed the spacer material and the etch stop material.

Having described preferred embodiments of single-mask alternating line deposition (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming lines in an integrated chip, comprising:
   depositing an etch stop layer on an underlying substrate;
   depositing a dielectric layer on the etch stop layer;
   forming trenches in the dielectric layer with an etch that stops on the etch stop layer;
   etching away portions of the etch stop layer exposed by the trenches to expose portions of a top surface of the underlying substrate;
   forming first lines on the underlying substrate;
   forming conformal dielectric spacers on sidewalls of the first lines; and
   forming second lines on the underlying substrate, in open areas between the dielectric spacers.

2. The method of forming lines in an integrated chip according to claim 1, wherein forming the conformal dielectric spacers comprises conformally depositing a layer of dielectric material on the first lines and removing the dielectric material from horizontal surfaces above and between the first lines.

3. The method of forming lines in an integrated chip according to claim 2, wherein removing the dielectric material from horizontal surfaces above and between the first lines comprises performing an anisotropic etch that is blocked in part by a top portion of the conformal dielectric spacers, such that the conformal dielectric spacers each include a foot of dielectric material that extends laterally from a bottom portion of the respective conformal dielectric spacer, into a space between the first lines.

4. The method of forming lines in an integrated chip according to claim 1, wherein forming the first lines comprises:
   depositing first line material in the trenches; and
   polishing away any first line material above the dielectric layer using a chemical mechanical planarization process that stops on the dielectric layer and that removes any connecting first line material from between the trenches.

5. The method of forming lines in an integrated chip according to claim 4, further comprising:
   isotropically etching away the dielectric layer from between the first lines, before forming the conformal dielectric spacers, to create a space between the first lines; and
   anisotropically etching away portions of the etch stop layer that are not protected by the conformal dielectric spacers, leaving etch stop remnants between the conformal dielectric spacers and the underlying substrate, to extend the space between the first lines down to the underlying substrate.

6. The method of forming lines in an integrated chip according to claim 1, wherein forming the trenches in the dielectric layer is performed with an anisotropic etch that leaves sloped sidewalls, such that the trenches in the dielectric layer taper at the bottom, from a relatively large width at the top to a relatively small width at the bottom.

7. The method of forming lines in an integrated chip according to claim 6, wherein the first lines taper at the bottom and the second lines taper at the top.

8. The method of forming lines in an integrated chip according to claim 1, wherein the first lines are formed from a first conductive material, and wherein the second lines are formed from a second conductive material having a conductive composition is distinct from the first conductive material.

9. A method of forming lines in an integrated chip according to forming lines in an integrated chip, comprising:
   depositing an etch stop layer on an underlying substrate, the etch stop layer having gaps that expose a top surface of the underlying substrate;
   forming first lines on the exposed surface of the underlying substrate in the gaps of the etch stop layer;
   conformally depositing a layer of dielectric material on exposed surfaces of the first lines;
   anisotropically etching dielectric material, from the layer of dielectric material, that is on horizontal surfaces above and between the first lines, wherein the anisotropic etch is blocked in part by a top portion of the conformal dielectric spacers, such that the conformal dielectric spacers each include a foot of dielectric material that extends laterally from a bottom portion of the respective conformal dielectric spacer, into a space between the first lines; and
   forming second lines on the underlying substrate, in openings left between the dielectric spacers.

10. The method of forming lines in an integrated chip according to claim 9, further comprising anisotropically etching away portions of the etch stop layer that are not protected by the conformal dielectric spacers, leaving etch stop remnants between the conformal dielectric spacers and the underlying substrate, underneath the foot of dielectric material, such that the etch stop remnants extend at least as far laterally as each respective foot of dielectric material.

11. The method of forming lines in an integrated chip according to claim 9, wherein the first lines taper at the bottom and the second lines taper at the top.

12. The method of forming lines in an integrated chip according to claim 9, wherein the first lines are formed from a first conductive material, and wherein the second lines are formed from a second conductive material that is distinct from the first conductive material.

13. A method of forming lines in an integrated chip, comprising:
   depositing an etch stop layer on an underlying substrate;
   depositing a dielectric layer on the etch stop layer, from a material that is selectively etchable with respect to the etch stop layer;
   forming trenches in the dielectric layer with a selective anisotropic etch that stops on the etch stop layer;
   etching away portions of the etch stop layer exposed by the trenches, using a selective anisotropic etch, to expose portions of a top surface of the underlying substrate;
   forming first lines on the underlying substrate, after forming the dielectric layer;
   forming conformal dielectric spacers on sidewalls of the first lines; and
   forming second lines on the underlying substrate, in open areas between the dielectric spacers.

14. The method of forming lines in an integrated chip according to claim 13, wherein forming the first lines comprises:
   depositing first line material in the trenches; and
   polishing away any first line material above the dielectric layer using a chemical mechanical planarization process that stops on the dielectric layer and that removes any connecting first line material from between the trenches.

15. The method of forming lines in an integrated chip according to claim 14, further comprising:
   isotropically etching away the dielectric layer from between the first lines, before forming the conformal dielectric spacers, to create a space between the first lines; and
   anisotropically etching away portions of the etch stop layer that are not protected by the conformal dielectric spacers, leaving etch stop remnants between the conformal dielectric spacers and the underlying substrate, to extend the space between the first lines down to the underlying substrate.

16. The method of forming lines in an integrated chip according to claim 13, wherein forming the trenches in the dielectric layer is performed with an anisotropic etch that leaves sloped sidewalls, such that the trenches in the dielectric layer taper at the bottom, from a relatively large width at the top to a relatively small width at the bottom.

17. The method of forming lines in an integrated chip according to claim 16, wherein the first lines taper at the bottom and the second lines taper at the top.

18. The method of forming lines in an integrated chip according to claim 13, wherein forming the conformal dielectric spacers comprises conformally depositing a layer of dielectric material on the first lines and removing the dielectric material from horizontal surfaces above and between the first lines.

* * * * *